United States Patent [19]

Hirai

[11] Patent Number: 5,285,097
[45] Date of Patent: Feb. 8, 1994

[54] SEMICONDUCTOR SENSOR OF ELECTROSTATIC CAPACITANCE TYPE

[75] Inventor: Yutaka Hirai, Tokyo, Japan

[73] Assignee: Canon Kabushiki Kaisha, Tokyo, Japan

[21] Appl. No.: 838,891

[22] Filed: Feb. 21, 1992

[30] Foreign Application Priority Data

Feb. 25, 1991 [JP] Japan ................................ 3-30394

[51] Int. Cl.⁵ .............................................. H01L 29/84
[52] U.S. Cl. ...................................... 257/417; 257/418;
257/419; 73/718; 73/724; 73/517 R; 361/283.1
[58] Field of Search ................ 357/25, 26, 68; 73/718,
73/724, 720, 726, 777, 760, 768; 280/735;
361/283, 280; 257/415, 417, 418, 419, 420

[56] References Cited

U.S. PATENT DOCUMENTS

| | | | |
|---|---|---|---|
| 4,357,834 | 11/1982 | Kimura | 73/718 XR |
| 4,628,403 | 12/1986 | Kuisma | 73/718 XR |
| 4,875,134 | 10/1989 | Kuisma | 73/718 XR |
| 5,012,304 | 4/1991 | Kash et al. | 357/26 XR |
| 5,048,343 | 9/1991 | Oboodi et al. | 73/766 |

FOREIGN PATENT DOCUMENTS 2156078  10/1985  United Kingdom ................ 73/718

Primary Examiner—William Mintel
Attorney, Agent, or Firm—Fitzpatrick, Cella, Harper & Scinto

[57] ABSTRACT

A semiconductor sensor has a semiconductor substrate including both of a conductive or semiconductor surface and an insulative surface and a pair of conductive members provided on said conductive or semiconductor surface of the substrate. There is constructed a sensor section in which at least one of the pair of conductive members can be deformed and an electrostatic capacitance between the pair of conductive members is variable. The semiconductor substrate has a functional element which is electrically connected to the sensor section.

11 Claims, 9 Drawing Sheets

SEMICONDUCTOR SENSOR OF ELECTROSTATIC CAPACITANCE TYPE

BACKGROUND OF THE INVENTION

1. Field of the Invention

The invention relates to a semiconductor sensor to detect dynamic amounts such as acceleration, pressure, and the like and, more particularly, to a semiconductor sensor of the electrostatic capacitance type of detect a change in electrostatic capacitance of a displacement portion which is deformed according to an acceleration or pressure.

2. Related Background Art

As a conventional semiconductor sensor, there is known a sensor having a structure in which a silicon wafer is worked into a diaphragm shape and a resistance layer is formed thereon. In such a type of sensor, a change in resistance of the resistance layer due to a deformation of the diaphragm is detected by using a Wheatstone bridge circuit.

On the other hand, according to the conventional pressure sensor of the electrostatic capacitance type, a change in electrostatic capacitance due to deformations of two metallic diaphragms is detected by an external circuit.

The conventional semiconductor sensor, however, still has many points to be improved with respect to the detecting sensitivity, stability, corrosion resistance, and the like.

The conventional pressure sensor of the electrostatic capacitance type still has many points to be improved with regard to the miniaturization, connection with an external circuit, and the like.

On the other hand, in association with the progress of information equipment, consumer equipment, and control units, a demand for sensors using semiconductors is increasing more and more increasing. Various kinds of sensors have been developed to measure light, electricity, magnetism, acoustic wave, chemistry, dynamics, and the like. However, in association with the remarkable advancement in the development of robots or the like, the development of sensors for detecting and controlling a dynamic amount and having an excellent performance is demanded. Moreover, miniaturization and realization of a hybrid structure of the acceleration sensor and pressure sensor are required due to progress of the micromechanics technique.

SUMMARY OF THE INVENTION

It is an object of the invention to provide a semiconductor sensor made by simple manufacturing processes and to which a signal processing circuit and a control circuit can be easily connected and which is a compact sensor of a high performance.

Another object of the invention is to provide a semiconductor sensor comprising a semiconductor substrate including a conductive or semiconductor surface and an insulative surface and a pair of conductive members provided on the conductive or semiconductor surface of the substrate, wherein there is constructed a sensor section in which at least one of the pair of conductive members can be deformed and an electrostatic capacitance between the pair of electrodes is variable, and the semiconductor substrate has a functional element which is electrically connected to the sensor section.

Still another object of the invention is to provide a semiconductor sensor comprising a semiconductor substrate including a conductive or semiconductor surface and an insulative surface and a sensor section including a pair of conductive members arranged on the conductive or semiconductor surface of the substrate, wherein at least one of the pair of conductive members can be deformed and at least one of the pair of conductive members is an epitaxial grown layer.

Further another object of the invention is to provide a semiconductor sensor in which a conductive film in a semiconductor device is used as an electrode for detection having a sufficient mechanical strength and can be easily electrically connected to elements for a signal processing circuit and a control circuit and having improved reliability.

According to a manufacturing method of a semiconductor sensor of the invention, after an IC is formed onto the substrate, the semiconductor device can be formed by a simple processing step of merely selectively forming an electrode, so that the yield rises and the costs can be also reduced.

DETAILED DESCRIPTION OF THE PREFERRED EMBODIMENTS

Figure 1A:
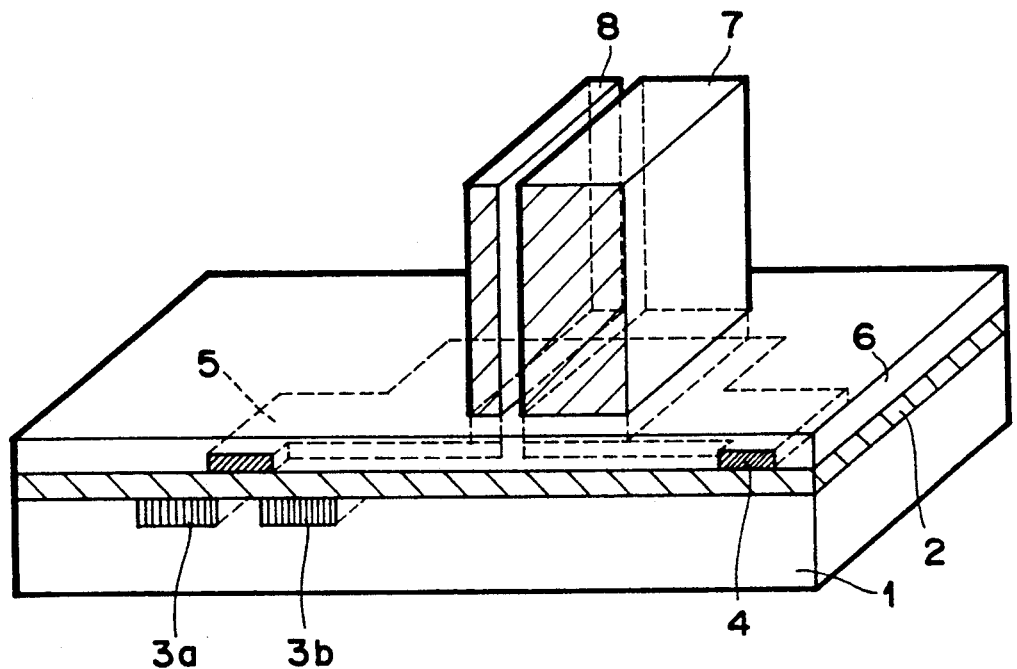
FIGS. 1A and 1B are respectively a respective view with a part cut away showing a semiconductor device according to the invention having an acceleration sensor and a circuit diagram thereof.

Preferred embodiments of the invention will be described hereinbelow. However, the invention is not limited to those embodiments but many modifications and variations are possible within the spirit and scope of the appended claims of the invention.

FIG. 1 is a schematic constructional diagram of a semiconductor sensor of the invention. Reference numeral 1 denotes a substrate. A monocrystalline Si is used as a material of the substrate 1 in the embodiment. A transistor (SW) having an MOS structure and serving as a functional element is formed in a part of the substrate 1. A source $3a$ and a drain $3b$ are formed by a diffusion or the like and a thermal oxidation film 2 for a gate is formed. Electrode layers 4 and 5 of low resistances which provide conductive or semiconductor surfaces and which have been patterned into desired shapes by photolithography are formed on the thermal oxidation film 2. A passivation layer 6 which provides the insulative surface is formed on the electrode layers 4 and 5. Two opening portions which have been patterned by lithography are formed in the passivation layer 6. The electrode layers 4 and 5 are respectively exposed from those two opening portions. A fixed detecting electrode 7 and a movable detecting electrode 8 serving as a detecting section are vertically formed on the substrate surface from the electrode layers 4 and 5 through the opening portions by an epitaxial growth. The fixed detecting electrode 7 and the movable detecting electrode 8 are made of conductive members which are vertically long and form an acceleration sensor of the electrostatic capacitance type.

A voltage applied to the electrode layer 4 changes in accordance with a capacitance change according to a deformation of the movable detecting electrode 8. Thus, a voltage change of the gate electrode 7 is induced and a current flowing from the diffusion layer $3a$ of the source to the diffusion layer $3b$ of the drain changes. The deformation of the movable detecting electrode 8 according to the acceleration can be detected by an external circuit (AMP) from the current change. A diagram of the external circuit is shown in FIG. 1B.

In the semiconductor device of the invention, for instance, n type monocrystalline Si is used as a material of the substrate and boron is used as a material of the diffusion layer, thereby forming a p type layer. As a material of each of the low resistance electrode layers 4 and 5, there is used doped poly Si, doped monocrystalline Si, metal having a high melting pointy such as W, Ti, Ta, Mo, or the like, Au, Pd, Pt, TiN, AlSi, or the like. A metal silicide or the like of the above metal can be also used. As a manufacturing method of the electrode layers 4 and 5, LPCVD (low pressure CVD), ordinary pressure CVD, sputtering, evaporation deposition, or the like is used. Any of the insulative materials can be used as a material of the passivation layer 6. Practically speaking, in addition to $SiO_2$, $Si_3N_4$, a-Si: N: H, and tantalum oxide, ceramics and the like can be also used. A CVD method, a sputtering method, or the like is preferable as a manufacturing method of the passivation layer 6.

As a material of each of the electrodes 7 and 8, it is possible to select a proper material from among Al, W, An, Mo, Ta, Ti, Tin, Cr, Cu, Pd, Pt, monocrystalline Si, polycrystalline Si, and the like. A desirable material is selected from among Al, W, Mo, Au, monocrystalline Si, and polycrystalline Si, Al, W, or Si is used as an optimum material.

Figure 1B:
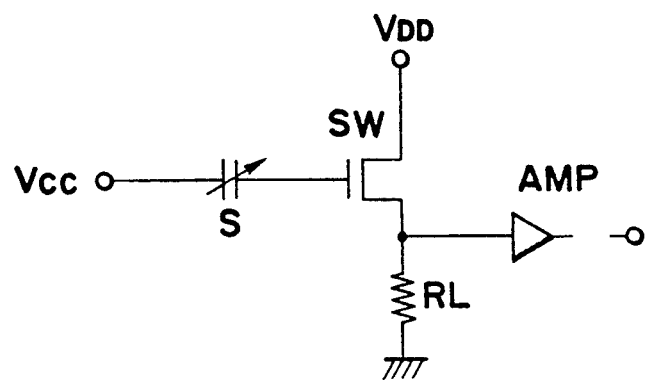

In FIG. 1A, a peripheral processing circuit (AMP) such as an amplifier comprising an MOS transistor or a bipolar transistor or the like can be also obviously assembled on the same substrate 1. Although not shown in FIG. 1A, by adding a flexible member to the upper portions of the electrodes 7 and 8 of the semiconductor device of FIG. 1A, the semiconductor device can be also used as a pressure sensor to detect a change in capacitance by a change in the gap between the electrodes 7 and 8 because the movable detecting electrode 7 is deformed when a pressure is applied from the upper portion.

An example of a manufacturing method of the semiconductor sensor of the invention will now be described with reference to FIGS. 2A to 2D.

Figure 2A:
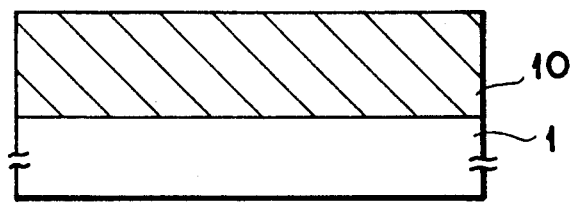
FIGS. 2A to 2D are processing step diagrams showing an example of a manufacturing method of the semiconductor device according to the invention.

First, a film of $SiO_2$, $Si_3N_4$, tantalum oxide, or the like is deposited as a selective film 10 onto the substrate 1 by a method such as CVD, sputtering, or the like (FIG. 2A). Si is mainly used as a material of the substrate 1. However, as mentioned before in FIG. 1A, an MOS transistor can be also provided. As a material of the top portion of the substrate, a material other than Si can be also used so long as an epitaxial growth can be performed when the electrodes 7 and 8 are formed.

Figure 2B:
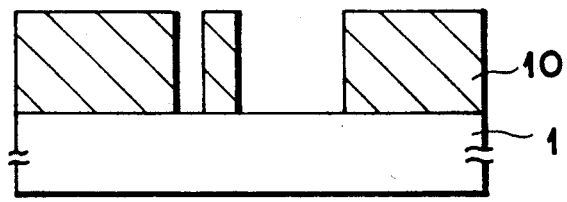

Opening portions to expose the surface of the substrate 1 are formed in the selective layer 10 by an electrode pattern of a desired size by photolithography (FIG. 2B). The electrode layers 7 and 8 are formed on the surface of the substrate 1 through the opening portions and epitaxially grown under conditions for selectively depositing them so as not to be adhered onto the selective layer 10.

A method of selectively depositing the electrode layers 7 and 8 will now be schematically explained. Al, W, or Si is selected as an optimum material of each of the electrode layers 7 and 8. In the case of Al, for instance, a vapor phase growth is used by using mixed gases comprising a raw material gas of dimethyl aluminum hydride (DMAH), monomethyl aluminum hydride ($MMAH_2$, or the like and a reaction gas of $H_2$. DMAH and $MMAH_2$ can be also mixedly used. An LPCVD apparatus which is generally used is suitable as a depositing apparatus. However, since the above raw material gas is in a liquid state, bubbling is performed by using $H_2$ or Ar (or another inert gas) as a carrier gas and gaseous DMAH or $MMAH_2$ is produced and is supplied to a mixer. It is mixed with $H_2$ introduced from another path. The resultant mixture gases are led into the apparatus.

A temperature of the gas in the film forming operation shown in FIG. 2B is selected to a value within a range from 160° to 450° C. A pressure of the gas in the film forming operation can be selected to a value within a range from $10^{-3}$ to 760 Torr.

A more preferable temperature of the substrate is set to a value within a range from 200° to 450° C. In the case of executing the deposition under the above condition, a depositing speed is large when a DMAH partial pressure lies within a range from $10^{-4}$ to $10^{-3}$ Torr. A flat film can be deposited onto the surface.

When the substrate temperature lies within a range from 270° to 350° C., polycrystalline Al having a strong orientation can be deposited. Monocrystalline Al can be also deposited according to the condition. An electrode which is also mechanically strong is obtained. When W is used as a material of the electrode, $WF_6$ is used. When Si is used, mixture gases of $SiH_2Cl_2$ or $SiHCl_2$ or $SiCl_4$ and $HCL+H_2$, or the like are used.

After the electrode layers 7 and 8 reach the upper portion of the selective layer 10 (FIG. 2C), the deposition is stopped and the selective layer 10 is eliminated by an etching method. As an etching method, the selective layer 10 is eliminated by a wet etching method. Any one of the wet etching method and the dry etching method can be used as an etching method. However, a dry method is more preferable. Mixture gases of $CF_4$ and O₂ are used as gases. By completely eliminating the selective layer 10, an epitaxial layer grows on the substrate. A semiconductor device having the function of the acceleration sensor which is constructed by the electrode layers 7 and 8 is completed.

Film Forming Method

A film forming method which is suitable to form electrodes in the semiconductor sensor according to the invention will be described hereinbelow. According to the invention, methods other than the above method can be also used.

The above film forming method is extremely suitable to bury a conductive material into the opening in order to form the electrode with the above construction.

According to the film forming method suitable to the invention, a deposition film is formed onto the electron donative substrate by a surface reaction by using an alkyl aluminum hydride gas and a hydrogen gas (hereinafter, referred to as an Al-CVD method).

Particularly, monomethyl aluminum hydride (MMAH) or dimethyl aluminum hydride (DMAH) is used as a raw material gas and an H₂ gas is used as a reaction gas. By heating the substrate surface under those mixture gases, an Al film of good quality can be deposited. When Al is selectively deposited, it is preferable to keep the temperature of the substrate surface to a value which is equal to or higher than a decomposition temperature of alkyl aluminum hydride and is less than 450° C. by directly or indirectly heating. More preferably, the substrate surface temperature is set to a value which is equal to or higher than 260° C. and is equal to or less than 440° C.

A direct heating method and an indirect heating method can be mentioned as a method of heating the substrate temperature to a value within the above range. Particularly, by holding the substrate temperature within the above temperature range by the direct heating method, an Al film of good quality can be formed with a high depositing speed. For instance, when the substrate surface temperature upon formation of the Al film is set to a value within a more preferable range from 260° to 440° C., a film of good quality can be obtained at a depositing speed higher than that in the case of resistance heating at a ratio of 300 Å to 500 Å/min. As such a direct heating method (energy from a heating means is directly transferred to the substrate and heats the substrate itself), for instance, lamp heating by a halogen lamp, a xenon lamp, or the like can be mentioned. There is resistor heating as an indirect heating method. The substrate can be indirectly heated by using a heat generating element or the like provided in a substrate supporting member arranged in a space to form a deposition film to support the substrate to form a deposition film.

When a CVD method is applied to the substrate in which both of the electron donative surface portion and the non-electron donative surface portion are formed by the above method, a monocrystal of Al is preferably selectively formed in only the electron donative substrate surface portion. The above Al monocrystal has all the excellent characteristics which are desired for an electrode/wiring material. That is, reduction of the probability of occurrence of either hillock or alloy spikes is accomplished.

It is considered that this is because an Al film of a good quality can be selectively formed on the surface made of a semiconductor or a conductive material as an electron donative surface and the Al film has an excellent crystallinity, so that the formation of alloy spikes or the like by an eutectic reaction with silicon, or the like as an underlayer or the like rarely occurs or is extremely small. When used as an electrode of the semiconductor device, the effect exceeds the concept of the conventional Al electrode and cannot be presumed in the conventional technique.

As described above, the Al layer which has been formed on the electron donative surface, for instance, on the insulative film and has been deposited in the opening in which the semiconductor substrate surface is exposed has a monocrystalline structure. However, according to the Al-CVD method, the following method film made of Al as a main component can be also selectively deposited and its film quality also exhibits excellent characteristics.

For instance, as well as the gas of alkyl aluminum hydride and hydrogen, a gas containing Si atoms such as $SiH_4$, $Si_2H_6$, $Si_3H_8$, $Si(CH_3)_4$, $SiCl_4$, $SiH_2Cl_2$, $SiHCl_3$, etc., a gas containing Ti atoms such as $TiCl_4$, $TiBr_4$, $Ti(CH_3)_4$, etc., or a gas containing Cu atoms such as bisacetyl acetonate copper $Cu(C_5H_7O_2)$, bisdipivaloyl methanite copper $Cu(C_{11}H_{19}O_2)_2$, bishexafluoro acetyl acetonate copper $Cu(C_5HF_6O_2)_2$, etc. is properly combined and introduced and used as a mixture gas atmosphere, and a conductive material such as Al-Si, Al-Ti, Al-Cu, Al-Si-Ti, Al-Si-Cu, etc. is selectively deposited, and an electrode can be also formed.

The above Al-CVD method is a film forming method having an excellent selectivity and a surface property of the deposited film is good. Therefore, a non-selective film forming method is applied to the next depositing step to form a metal film made of Al or containing Al as a main component onto the Al film which has selectively been deposited and an $SiO_2$ film as an insulative film or the like. Thus, a preferable metal film having a high generality for use as a wiring of the semiconductor device can be obtained.

Practically speaking, as such a metal film, there can be mentioned combinations of Al, Al-Si, Al-Ti, Al-Cu, Al-Si-Ti, or Al-Si-Cu which has selectively been deposited and Al, Al-Si, Al-Ti, Al-Cu, Al-Si-Ti, or Al-Si-Cu which has non-selectively been deposited, or the like.

As a film forming method for the non-selective deposition, a CVD method, a sputtering method, or the like other than the above Al-CVD method can be mentioned.

Film Forming Apparatus

A film forming apparatus which is suitable to form electrodes according to the invention will now be described.

Figure 5:
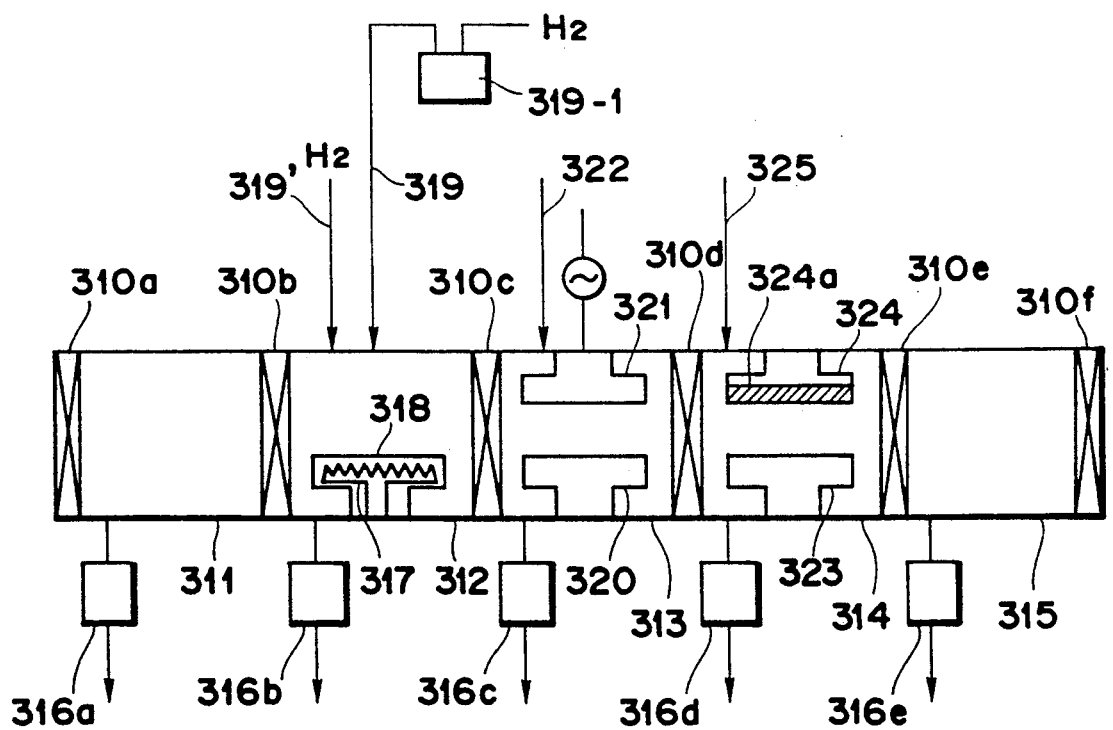
FIG. 5 is a schematic constructional diagram showing an example of a manufacturing apparatus which advantageously applies the manufacturing method of the semiconductor device according to the invention.
Figure 6:
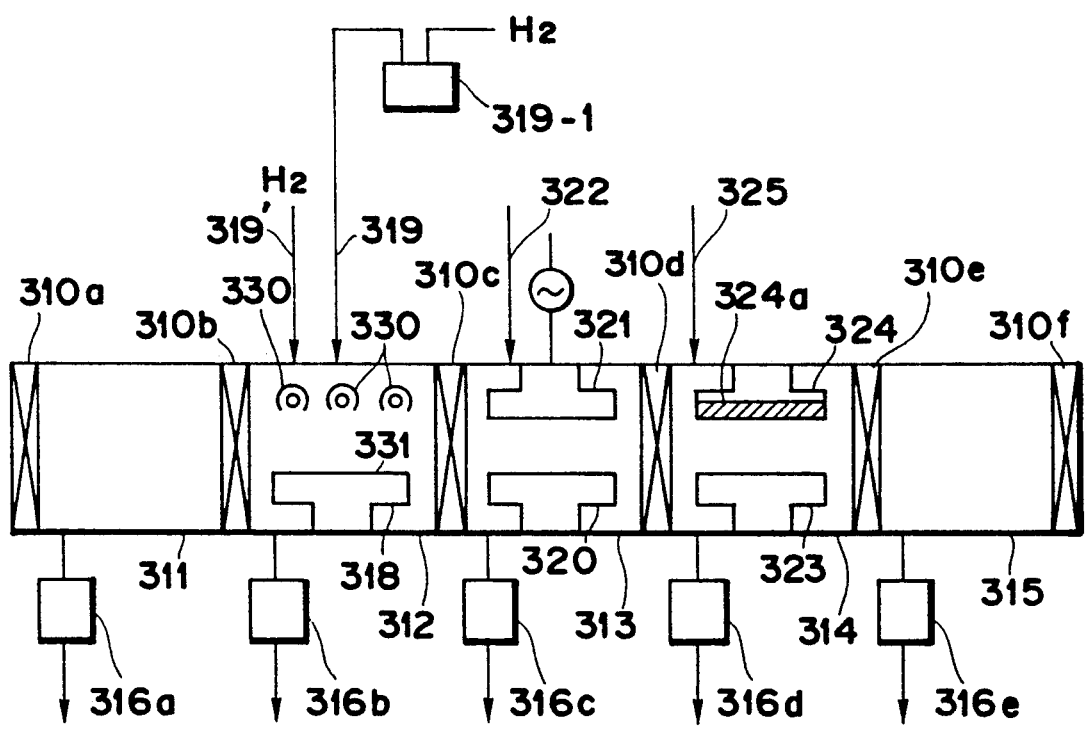
FIG. 6 is a schematic constructional diagram showing an example of the manufacturing apparatus which advantageously applies a manufacturing method of the semiconductor device according to the invention.
Figure 7:
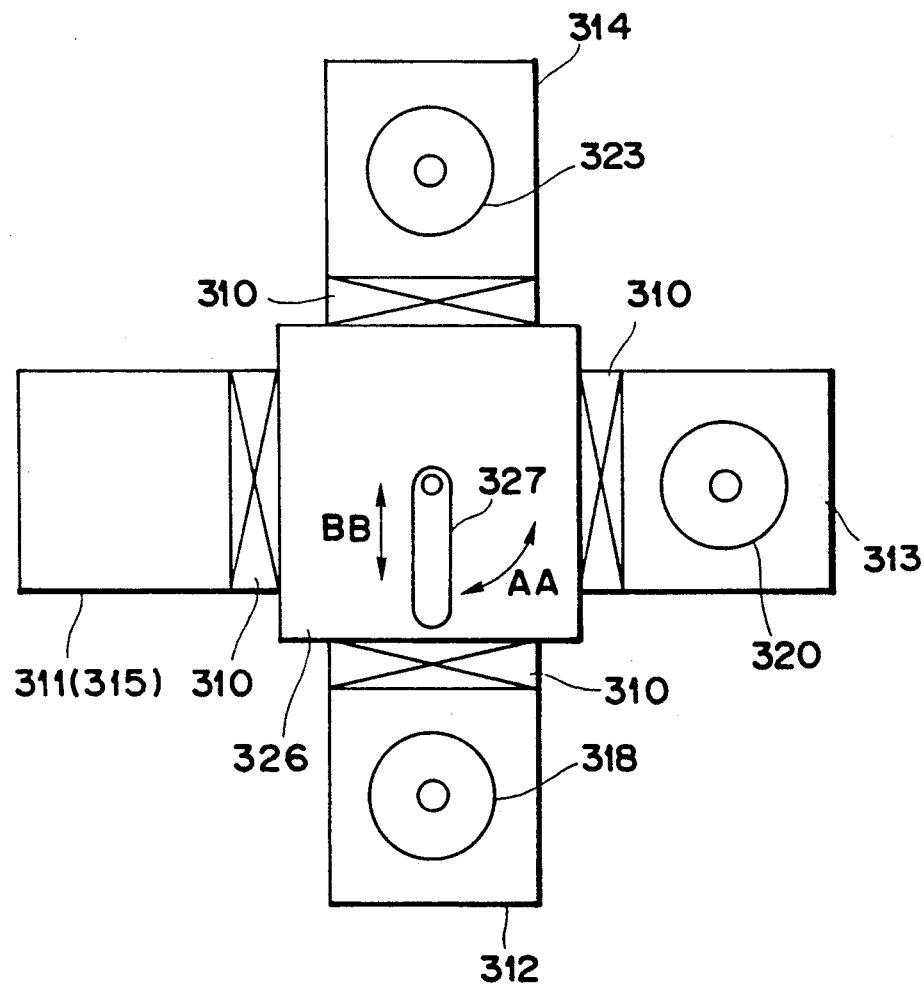
FIG. 7 is a schematic constructional diagram showing an a manufacturing apparatus which advantageously applies the manufacturing method of the semiconductor device according to the invention.

FIGS. 5 to 7 diagrammatically show a metal film continuous forming apparatus which is suitable to apply the above film forming method.

As shown in FIG. 5, the metal film continuous forming apparatus is constructed by: a load locking chamber 311; a CVD reaction chamber 312 as a first film forming chamber; an Rf etching chamber 313; a sputtering chamber 314 as a second film forming chamber; and a load locking chamber 315. The chambers 311 to 315 are coupled so that they can be communicated with each other by gate valves 310a to 310f under the shut-out condition of the open air. Those chambers are exhausted by exhaust systems 316a to 316e and their pressures can be reduced, respectively. The load locking chamber 311 is provided for exhausting the substrate atmosphere before the deposition process and, thereafter, for replacing it by the H₂ atmosphere in order to improve a throughput. The next CVD reaction chamber 312 is provided for executing the foregoing selective deposition by the Al-CVD method onto the substrate under ordinary or reduced pressure. A substrate holder 318 having a heat generating resistor 317 which can heat the substrate surface onto which a film should be formed within a temperature range of at least 200° to 450° C. is provided in the CVD reaction chamber 312. A raw material gas such as alkyl aluminum hydride or the like which has been bubbled and vaporized by hydrogen by a bubbler 319-1 is introduced into the chamber by a raw material gas introducing line 319 for CVD. A hydrogen gas as a reaction gas is introduced by a gas line 319'. The next Rf etching chamber 313 is provided to clean (etch) the substrate surface after completion of the selective deposition under the Ar atmosphere. A substrate holder 320 which can heat the substrate within a range of at least 100° to 250° C. and an electrode line 321 for Rf etching are provided in the Rf etching chamber 313. An Ar gas supply line 322 is connected to the Rf etching chamber 313. The sputtering chamber 314 is provided to non-selectively deposit a metal film onto the substrate surface by sputtering under the Ar atmosphere. A substrate holder 323 which is heated within a range of at least 200° to 250° C. and a target electrode 324 to attach a sputtering target material 324a are provided in the sputtering chamber 314. An Ar gas supply line 325 is connected to the sputtering chamber 314. The last load locking chamber 315 is an adjusting chamber before the substrate after completion of the deposition of the metal film is ejected into the open air and is constructed so as to substitute the atmosphere to N₂.

FIG. 6 shows another constructional example of a metal film continuous forming apparatus which is suitable to apply the foregoing film forming method. In FIG. 6, the same parts and components as those shown in FIG. 5 are designated by the same reference numerals. The apparatus of FIG. 6 differs from the apparatus of FIG. 5 in that a halogen lamp 330 as direct heating means is provided and the substrate surface can be directly heated. For this purpose, a nail 331 to hold the substrate in a floating state is arranged in the substrate holder 318.

With the above construction, by directly heating the substrate surface, the depositing speed can be further improved as mentioned above.

Figure 8:
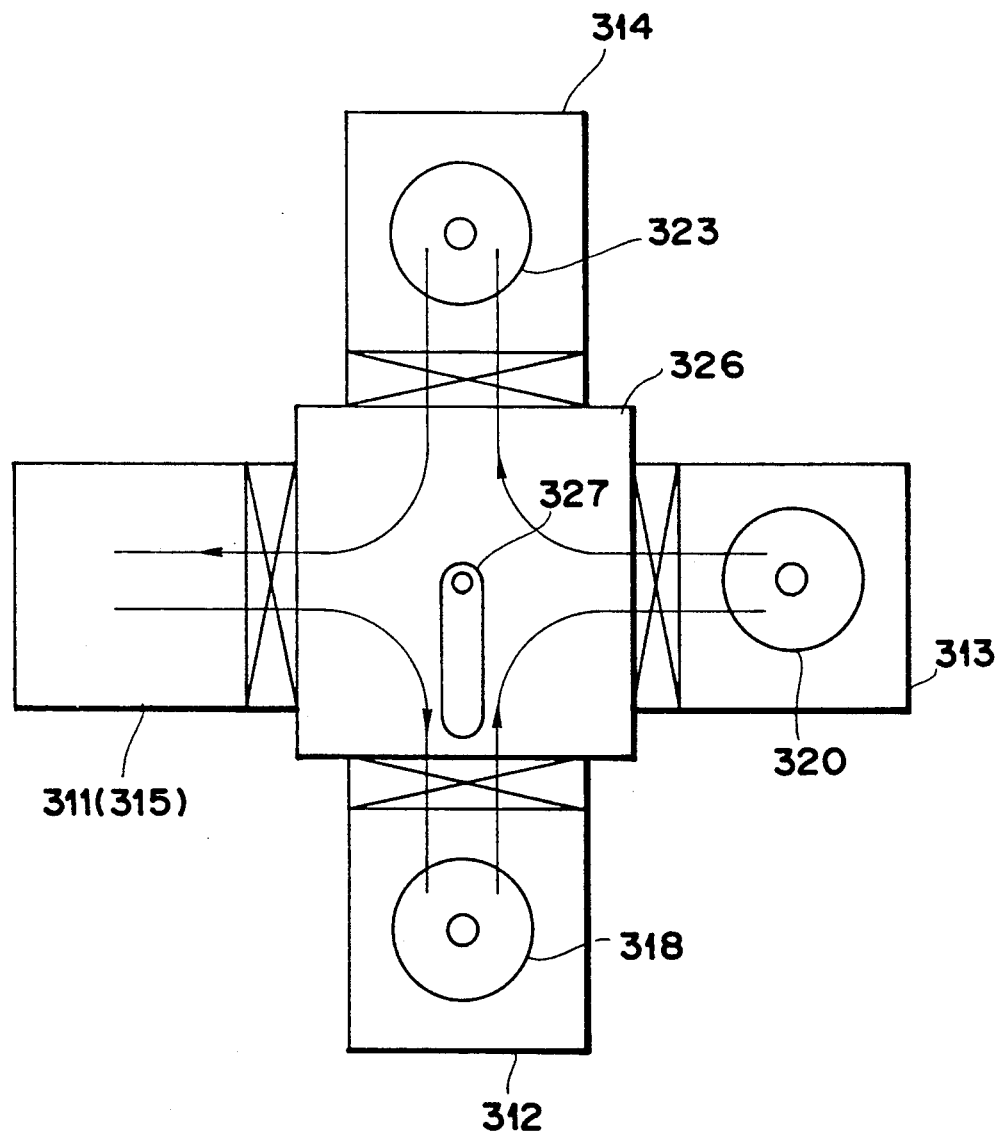
FIG. 8 is a schematic constructional diagram showing of a manufacturing apparatus which advantageously applies the manufacturing method of the semiconductor device according to the invention.

As shown in FIG. 7, the metal film continuous forming apparatus with the above construction is actually substantially equivalent to the apparatus having a structure such that the load locking chamber 311, CVD reaction chamber 312, Rf etching chamber 313, sputtering chamber 314, and load locking chamber 315 are mutually coupled by using a conveying chamber 326 as a junction chamber. In the above construction, the load locking chamber 311 also serves as a load locking chamber 315. As shown in FIG. 7, an arm 327 as conveying means which can be forwardly/reversely rotated in AA directions and can be expanded or contracted in BB directions is provided in the conveying chamber 326. The substrate can be continuously sequentially moved from the load locking chamber 311 to the CVD chamber 312, Rf etching chamber 313, sputtering chamber 314, and load locking chamber 315 by the arm 327 in accordance with the processing steps as shown by arrows in FIG. 8 without coming into contact with the open air.

Film Forming Procedure

A film forming procedure to form electrodes and wirings according to the invention will now be described.

FIGS. 9A to 9D are schematic perspective views for explaining the film forming procedure to form electrodes and wirings according to the invention.

An outline will be first described. A semiconductor substrate in which openings are formed in the insulative film is prepared. The substrate is arranged in the film forming chamber and the substrate surface is held at a temperature within a range, for instance, from 260° to 450° C. Al is selectively deposited into the exposed portions of the semiconductor in the openings by the thermal CVD method under the mixture atmosphere of a DMAH gas as alkyl aluminum hydride and a hydrogen gas. A metal film containing Al such as Al-Si or the like as a main component can be also obviously selectively deposited by introducing gases containing Si atoms or the like as mentioned above. A metal film made of Al or containing Al as a main component is non-selectively formed onto the selectively deposited Al and insulative film by a sputtering method. After that, by patterning the metal film which has non-selectively been deposited into a desired wiring shape, the electrodes and wirings can be formed.

An explanation will now be made with reference to FIGS. 6 and 7. A substrate is first prepared. For instance, a substrate consisting of an insulative film with openings having different dimensions formed on a monocrystalline Si wafer is prepared.

Figure 9A:
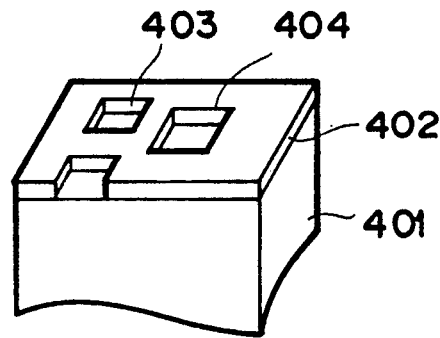
FIGS. 9A to 9D are schematic perspective views for explaining states of formation of a first wiring layer according to the manufacturing method of the semiconductor device by the invention.

FIG. 9A is a schematic diagram showing a part of the substrate. Reference numeral 401 denotes a monocrystalline silicon substrate as a conductive substrate; 402 a thermal oxidation silicon film as an insulative film (layer); and 403 and 404 openings (exposed portions) having different dimensions.

A procedure to form an Al film which functions as an electrode as a first wiring layer onto the substrate will now be described hereinbelow with reference to FIG. 6.

First, the above substrate is arranged into the load locking chamber 311. As mentioned above, hydrogen is introduced into the load locking chamber 311 so as to provide a hydrogen atmosphere. The inside of the reaction chamber 312 is exhausted to almost $1 \times 10^{-8}$ Torr by the exhaust system 316b. Al film can be formed even when a vacuum degree in the reaction chamber 312 is lower than $1 \times 10^{-8}$ Torr.

The bubbled DMAH gases are supplied from the gas line 319. H₂ is used as a carrier gas of the DMAH line.

The second gas line 319' is used for H₂ as a reaction gas. The H₂ gas is supplied from the second gas line 319', an opening degree of a slow leak valve (not shown) is adjusted, and the pressure in the reaction chamber 312 is set into a predetermined value. A typical pressure in the above case is preferably set to about 1.5 Torr. The DMAH gases are introduced into the reaction pipe from the DMAH line. The total pressure is set to about 1.5 Torr and the DMAH partial pressure is set to about $5.0 \times 10^{-3}$ Torr. After that, a current is supplied to the halogen lamp 330 and the wafer is directly heated. As mentioned above, an Al film is selectively deposited.

After the elapse of a predetermined depositing time, the supply of the DMAH gases is temporarily stopped. The predetermined depositing time of the Al film which is deposited during such a processing step corresponds to a time which is required until a thickness of Al film on Si (monocrystalline silicon substrate 1) is equal to a film thickness of $SiO_2$ (thermal oxidation silicon film 2) and such a time can be previously obtained by experiments.

Figure 9B:
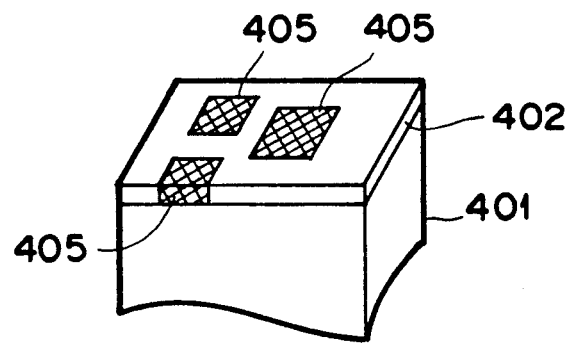

A temperature of substrate surface by the direct heating is set to about 270° C. According to the processing steps until now, an Al film 405 is selectively deposited into the openings as shown in FIG. 9B.

The above processing procedure is referred to as a first film forming step to form electrodes into the contact holes.

After completion of the first film forming step, the CVD reaction chamber 312 is exhausted by the exhaust system 316b until a vacuum degree in the CVD reaction chamber 312 reaches $5 \times 10^{-3}$ Torr or less. At the same time, the Rf etching chamber 313 is exhausted to $5 \times 10^{-6}$ Torr or less. After it was confirmed that the pressures in both of the chambers 312 and 313 have reached the above vacuum degrees, the gate valve 310c is opened, the substrate is moved from the CVD reaction chamber 312 to the Rf etching chamber 313 by the conveying means, and the gate valve 310c is closed. The substrate is conveyed to the Rf etching chamber 313. The Rf etching chamber 313 is exhausted by the exhaust system 316c until a vacuum degree reaches $10^{-6}$ Torr or less. After that, argon is supplied by the Ar gas supply line 322 for Rf etching, thereby keeping the Rf etching chamber 313 into the argon atmosphere within a range from $10^{-1}$ to $10^{-3}$ Torr. The substrate holder 320 for Rf etching is held at about 200° C., an Rf power of 100 W is applied to the electrode 321 for Rf etching for about 60 seconds, thereby causing a discharge of argon in the Rf etching chamber 313. Due to this, the substrate surface can be etched by argon ions and the unnecessary surface layer of the CVD deposited film can be eliminated. An etching depth in the above case is set to about 100 Å as an oxide. Although the surface etching of the CVD deposited film has been performed in the Rf etching chamber in the above example, since the surface layer of the CVD film of the substrate which is conveyed in the vacuum does not contain oxygen and the like in the atmosphere, it is not always necessary to perform the Rf etching. In such a case, the Rf etching chamber 313 functions as a temperature changing room to change the temperature in a short time when there is a large temperature difference between the CVD reaction chamber 312 and the sputtering chamber 314.

After completion of the Rf etching in the Rf etching chamber 313, the inflow of argon is stopped and argon in the Rf etching chamber 313 is exhausted. The RF etching chamber 313 is exhausted until $5 \times 10^{-6}$ Torr and the sputtering chamber 314 is exhausted to $5 \times 10^{-6}$ Torr or less and, thereafter, the gate valve 310d is opened. After that, the substrate is moved from the Rf etching chamber 313 to the sputtering chamber 314 by using the conveying means and the gate valve 310d is closed.

After the substrate is conveyed to the sputtering chamber 314, the sputtering chamber 314 is set into the argon atmosphere of $10^{-1}$ to $10^{-3}$ Torr in a manner similar to the Rf etching chamber 313. A temperature of the substrate holder 323 to mount the substrate is set into a value within a range of about 200° to 250° C. A discharge of argon is executed by a DC power of 5 to 10 kw. A target material such as Al, Al-Si (Si: 0.5%), or the like is ground by argon ions and a metal film of Al, Al-Si, or the like is formed into the substrate at a depositing speed of about 10000 Å/min. The above processing steps are non-selective depositing steps and are referred to as a second film forming step to form wirings which are connected to the electrodes.

After the metal film of about 5000 Å is formed onto the substrate, the inflow of argon and the apply of the DC power are stopped. The load locking chamber 311 is exhausted to $5 \times 10^{-3}$ Torr or less and, after that, the gate valve 310e is opened and the substrate is moved. After the gate valve 310e was closed, the $N_2$ gas is supplied into the load locking chamber 311 until a pressure in the load locking chamber 311 reaches the atmospheric pressure. The gate valve 310f is opened and the substrate is taken out of the apparatus.

Figure 9C:
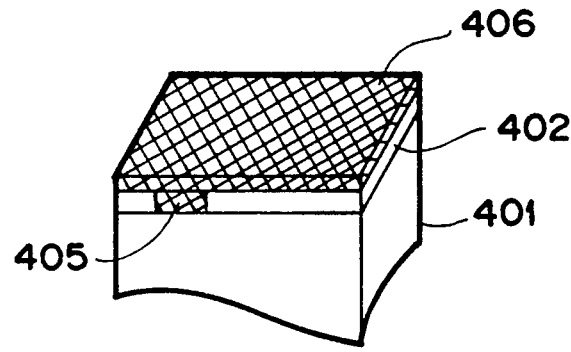

According to the second Al film depositing step mentioned above, an Al film 406 can be formed onto the $SiO_2$ film 402 as shown in FIG. 9C.

Figure 9D:
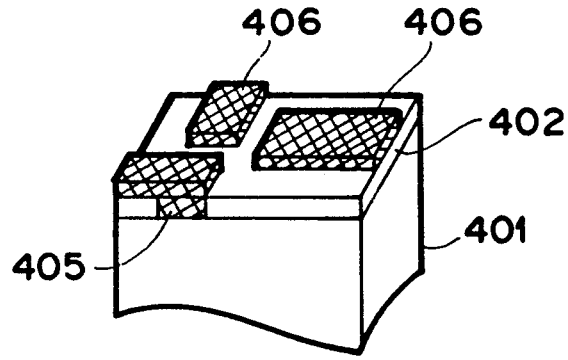

By patterning the Al film 406 as shown in FIG. 9D, wirings of desired shapes can be obtained.

Experiment Example

On the basis of the results of the experiments, an explanation will now be made hereinbelow in order to show that the above Al-CVD method is excellent and the Al film deposited into the openings consequently has a good quality.

First, the surface of the N type monocrystalline silicon wafer as a substrate is thermally oxidized and an $SiO_2$ film of 8000 Å is formed. The openings having different dimensions within a range from a square of 0.25 μm × 0.25 μm to a square of 100 μm × 100 μm are patterned and Si monocrystals of the underlayer are exposed. A plurality of such substrates are prepared (samples 101).

Al films are formed onto those substrates by the Al-CVD method under the following conditions. An amount of electric power which is applied to the halogen lamp is adjusted and temperatures of the substrate surfaces are set to values within a range from 200° to 490° C. by the direct heating and films are formed under the common conditions such that DMAH is used as a raw material gas, hydrogen is used as a reaction gas, a total pressure is set to 1.5 Torr, and a DMAH partial pressure is set to $5.0 \times 10^{-3}$ Torr.

The results are shown in Table 1.

TABLE 1

| Substrate surface temperature (°C.) | 200 | 230 | 250 | 260 | 270 | 280 | 300 | 350 | 400 | 440 | 450 | 460 | 470 | 480 | 490 |
|---|---|---|---|---|---|---|---|---|---|---|---|---|---|---|---|
| Depositing speed (Å/min) | ← | 1000~1500 | → | ← | ← | ← | ← | ← | 3000~5000 | | → | → | → | → | → |
| Throughput (films/hour) | ← | 7~10 | → | ← | ← | ← | ← | ← | 15~30 | → | → | → | → | → | → |
| Line defect of Si | ← | Not found out | | → | → | → | → | → | → | → | → | → | → | → | → |
| Content ratio of carbon | ← | Not detected | | → | → | → | → | → | → | → | → | → | → | → | → |
| Resistivity (μΩcm) | ← | 2.7~3.3 | → | ← | ← | ← | ← | ← | 2.8~3.4 | → | → | → | → | → | → |
| Reflectance (%) | ← | 8.5~9.5 | → | ← | ← | ← | ← | 90~95 | | → | ← | ~60 | | → | → |
| Density of hillock of 1 μm or more ($cm^{-2}$) | ← | 1~$10^2$ | → | ← | ← | ← | ← | 0~10 | | → | ← | 10~$10^4$ | | → | → |
| Occurrence ratio of spikes (%) (breakage probability of 0.15 μm | ← | 0 | → | → | → | → | → | → | → | → | ← | 0~30 | | → | → |

TABLE 1-continued junction)

As will be understood from Table 1, when the substrate surface temperature by the direct heating is equal to 260° C. or higher, Al films are selectively deposited in the openings at a high depositing speed of 3000 to 5000 Å/min.

The characteristics of the Al films in the openings when the substrate surface temperature lies within a range of 260° to 440° C. are examined. Thus, it has been confirmed that there are obtained good characteristics such that no carbon is contained, the resistivity lies within a range of 2.8 to 3.4 μΩ cm, the reflectance lies within a range of 90 to 95%, the density of hillock of 1 μm or more lies within a range of 0 to 10, and the spikes rarely occur (the breakage probability of the junction of 0.15 μm is very small).

On the other hand, when the substrate surface temperature lies within a range from 200° to 250° C. although the film qualities are slightly worse as compared with those in the case where the substrate surface temperature lies within a range from 260° to 440° C., the films are somewhat better than the films which are obtained by the conventional technique. However, the depositing speed lies within a range of 1000 to 1500 Å/min and is not so sufficiently high and the throughput lies within a range of 7 to 10 films/hour and is also relatively low.

When the substrate surface temperature is equal to or higher than 450° C., the reflectance is equal to or less than 60%, the density of hillock of 1 μm or more lies within a range of 10 to $10^4$ cm$^{-2}$, the occurrence ratio of alloy spikes lies within a range of 0 to 30%, and the characteristics of the Al film in the opening deteriorate.

How the above method can be preferably used for openings such as contact holes or through holes will now be described.

That is, the above method is also preferably applied to a contact hole/through hole structure made of the following material.

An Al film is formed onto the substrate (sample) with the following construction under the same conditions as those when the Al film had been formed onto the foregoing sample 1-1.

An oxidation silicon film by the CVD method as a second substrate surface material is formed onto monocrystalline silicon as a first substrate surface material. The patterning is performed by the photolithography step, thereby partially exposing the monocrystalline silicon surface.

A thickness of thermal oxidation $SiO_2$ film for this instance is equal to 8000 Å and sizes of exposed portions of monocrystalline silicon, that is, openings lie within a range from 0.25 μm × 0.25 μm to 100 μm × 100 μm. A sample 1-2 was prepared as mentioned above (hereinafter, such a sample is abbreviated to "CVD $SiO_2$ (hereinafter, abbreviated to $SiO_2$)/monocrystalline silicon").

A sample 1-3 is boron doped oxidation film (hereinafter, abbreviated to BSG)/monocrystalline silicon which has been formed by the ordinary pressure CVD. A sample 1-4 is a phosphorus doped oxidation film (hereinafter, abbreviated to PSG)/monocrystalline silicon which has been formed by the ordinary pressure CVD. A sample 1-5 is a phosphorus and boron doped oxidation film (hereinafter, abbreviated to BSPG)/monocrystalline silicon which has been formed by the ordinary pressure CVD. A sample 1-6 is a nitride film (hereinafter, abbreviated to P-SiN)/monocrystalline silicon which has been formed by the plasma CVD. A sample 1-7 is a thermal nitride film (hereinafter, abbreviated to T-SiN)/monocrystalline silicon. A sample 1-8 is a nitride film (hereinafter, abbreviated to LP-SiN)/monocrystalline silicon which has been formed by the reduced pressure CVD. A sample 1-9 is a nitride film (hereinafter, abbreviated ECR-SiN)/monocrystalline silicon which has been formed by the ECR apparatus.

Further, samples 1-11 to 1-179 (note: the sample Nos. 1-10, 20, 30, 40, 50, 60, 70, 80, 90, 100, 110, 120, 130, 140, 150, 160, and 170 are missing numbers) were formed by all of the combinations of the first substrate surface materials (18 kinds) and the second substrate surface materials (9 kinds) shown below. As the first substrate surface materials, there are used: monocrystalline silicon (monocrystalline Si); polycrystalline silicon (polycrystalline Si); amorphous silicon (amorphous Si); tungsten (W); molybdenum (Mo); tantalum (Ta); tungsten silicide (WSi); titanium silicide (TiSi); aluminum (Al); aluminum silicon (Al-Si); titanium aluminum (Al-Ti); titanium nitride (Ti-N); copper (Cu); aluminum silicon copper (Al-Si-Cu); aluminum palladium (Al-Pd); titanium (Ti); molybdenum silicide (Mo-Si); and tantalum silicide (Ta-Si). As the second substrate surface material, there are used: T-$SiO_2$; $SiO_2$; BSG; PSG; BPSG; P-SiN; T-SiN; LP-SiN; and ECR-SiN. With respect to all of the above samples, good Al films which are almost equivalent to the foregoing sample 1-1 could be also formed.

Al is non-selectively formed by the sputtering method onto the substrate on which Al was selectively deposited, and the patterning is performed.

Thus, the Al film derived by the sputtering method and the Al films which have been selectively deposited into the openings are held in a good contact state of high electrical and mechanical durabilities because the surfacenesses of the Al films in the openings are good.

Embodiment 1

Figure 2C:
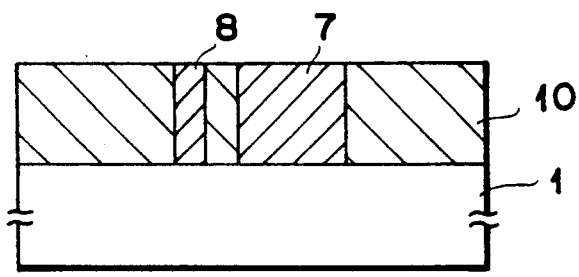
Figure 2D:
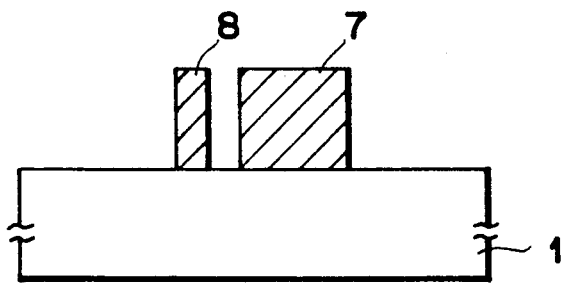
Figure 3A:
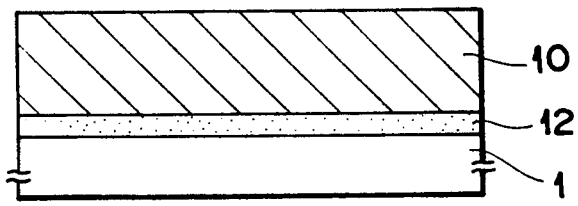
FIGS. 3A to 3D are processing step diagrams showing another example of a manufacturing method of the semiconductor device according to the invention.
Figure 3B:
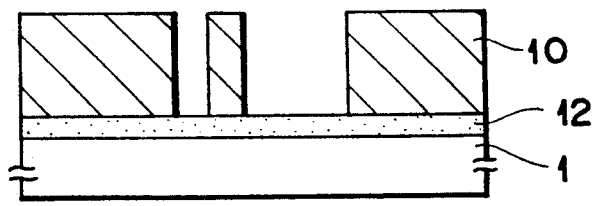
Figure 3C:
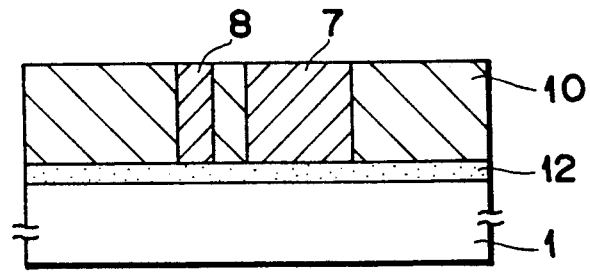
Figure 3D:
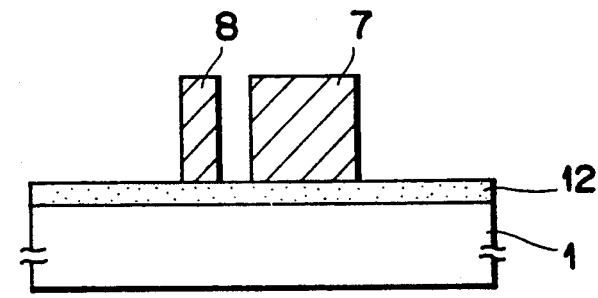

The acceleration sensor shown in FIG. 1 was formed by the processing steps shown in FIGS. 2A to 2D. First, an Si substrate (n type; specific resistance is equal to 0.5 Ω·cm) is prepared. The diffusion layers (source and drain) 3a and 3b are formed by the processes of the MOS transistor which are ordinarily used. The gate oxide film 2 having a thickness of 1000 Å is formed. After that, the electrode layer 5 also serving as a gate electrode of P doped polysilicon is simultaneously formed to the upper portion of the oxide film 2 together with the electrode layer 4 so as to each having a thickness of 2000 Å and they are patterned to desired shapes and sizes. The $Si_3N_4$ film having a thickness of 3000 Å is deposited by using $SiH_4$ and $NH_3$ by the LPCVD method and the $SiO_2$ film 10 having a thickness of 100 μm is subsequently grown by using $SiH_4$ and $O_2$. The patterning of the contact holes for the detecting electrodes is performed by etching the $SiO_2$ film 10 or $Si_3N_4$ film. The size of contact hole for the fixed detecting electrode 8 is set to 100 μm × 100 μm. The size of contact hole for the movable detecting electrode 7 is set to 100 μm × 5 μm. The Al films for the electrodes 7 and 8 each having a thickness of 100 μm are deposited by using the LPCVD apparatus similar to that used n the LPCVD method. Although the mixture gases of DMAH and $H_2$ were used, the DMAH gases are bubbled by using the carrier gas $H_2$ and introduced, the total pressure is set to 1.5 Torr, and the partial pressure of DMAH is set to $1.5 \times 10^{-4}$ Torr. The substrate temperature is set to 350° C. and the Al film having a thickness of 100 μm is deposited. The result is as shown in FIG. 2C. That is, the substrate 1 is made of doped polysilicon. An Al film is not deposited onto the $SiO_2$ film 10. The Al films 7 and 8 are deposited to only the contact hole portions in which polysilicon portions of the substrate 1 are exposed so as to bury the contact holes. When the Al deposited films 7 and 8 are observed by the X-ray diffraction, electron beam diffraction, and transmission electron microscope, it has been confirmed that although they are polycrystals, they are grown with the crystal face orientation of polysilicon of the underlayer 12.

By subsequently selectively etching eliminating only $SiO_2$ by the dry etching method using $CF_4 + O_2$ gas, the acceleration sensor in which the fixed detecting electrode (width: 100 μm, length: 100 μm, height: 100 μm) 7 and the movable detecting electrode (width: 5 μm. length: 100 μm, height: 100 μm) 8 are grown on the substrate 1 (electrodes 4 and 5, $Si_3N_4$ film 6) is formed (FIG. 1).

The characteristics of the acceleration sensor of the embodiment were measured, so that the good frequency characteristics and the displacement were obtained.

Embodiment 2

An Si substrate similar to the substrate used in the embodiment 1 is used, TiN of a thickness of 2000 Å is sputtered as an electrode material as shown in FIG. 3, and an electrode layer is formed. The subsequent processing steps are executed in a manner similar to the embodiment 1 and an acceleration sensor is formed. Frequency characteristics and a displacement of the sensor are good and are almost similar to those in the embodiment 1.

Embodiment 3

An Si substrate similar to the embodiment 1 is used. Electrodes and doped polysilicon are deposited onto the substrate and patterned. After that, contact holes are opened. W films each having a thickness of 500 Å are selectively deposited into only the polysilicon regions of the contact holes by using the LPCVD apparatus by the reduction reaction of $WF_6$ by $SiH_4$. After that, Al films are also deposited by using the LPCVD in a manner similar to the embodiment 1, thereby forming an acceleration sensor. Frequency characteristics and a displacement of the sensor are good and are similar to those in the embodiment 1.

Embodiment 4

Figure 4A:
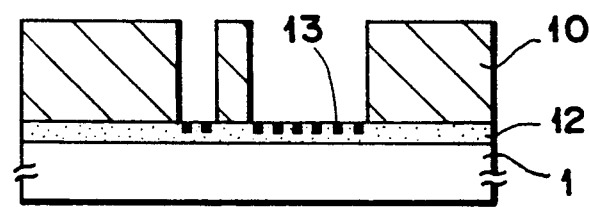
FIGS. 4A and 4B are processing step diagrams showing a part of still another example of the manufacturing method of the semiconductor device according to the invention.
Figure 4B:
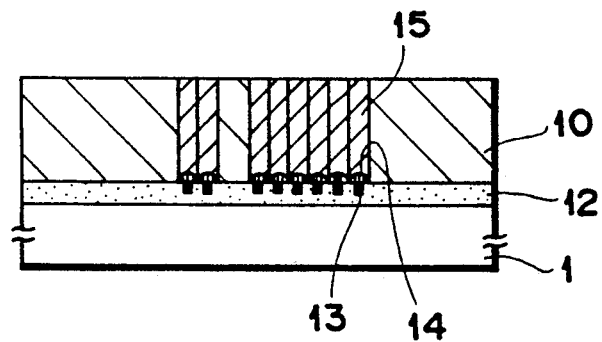

An Si substrate similar to the substrate used in the embodiment 1 is used. The $Si_3N_4$ film 12 as an underlayer having a thickness of 2000 Å is formed by the LPCVD. After that, a mask material is used and Si ions are implanted into the regions each having a size of 2 μm □ as portions corresponding to the bottom portions of the contact holes at intervals of 20 μm and at a density of $10^{21}$, thereby forming nuclei 13 (FIG. 4A). After that, the $SiO_2$ film 10 as a passivation film is formed by the LPCVD in a manner similar to the embodiment 1. Holes are formed in the same portions as the contact holes by patterning. Subsequently, doped monocrystalline Si (grain diameter is equal to about 10 μm) is formed at intervals of 20 μm by using $SiH_2Cl_2$, HCl, and $PH_3$ and a continuous film as an underlayer 14 is formed. Al is deposited in a manner similar to the embodiment 1. Thus, it has been confirmed that an electrode layer 15 made of Al is epitaxial grown as a monocrystal in accordance with the region of the monocrystalline Si as shown in FIG. 4B.

According to the embodiments as described above, the monocrystalline and polycrystalline electrode materials which have selectively been epitaxially grown from parts of the substrate are used as detecting electrodes on the Si substrate, so that a semiconductor device having a sensor of high performance can be formed by simple processes.

Particularly, in recent years, techniques for epitaxially growing the electrode materials onto the Si substrate has been started and seen remarkable advancement. However, applications thereof to formation of an acceleration sensor, pressure sensor, and the like using the above micromechanics technique are not reported yet.

What is claimed is:

1. A semiconductor sensor comprising:
    a substrate having a surface that is one of conductive and semiconductive and an insulative surface;
    a pair of conductive members provided on said conductive/semiconductive surface; and
    a semiconductor functional element for sensing an electrostatic capacitance between said pair of conductive members, and being electrically connected with at least one of said conductive members,
    wherein at least one of said conductive members can be deformed and the electrostatic capacitance between said conductive members varies in accordance with the deformation of said at least one conductive member, and
    wherein said conductive members and said semiconductor functional element are integrally formed on said substrate.

2. A sensor according to claim 1, wherein at least one of the pair of conductive members is fixed.

3. A sensor according to claim 1, wherein at least one of the pair of conductive members is made of a monocrystalline material.

4. A sensor according to claim 1, wherein at least one of the pair of conductive members is made of aluminum.

5. A sensor according to claim 4, wherein said aluminum is formed by a CVD method using alkyl aluminum hydride.

6. A sensor according to claim 1, wherein said semiconductor substrate further includes a signal processing unit integrally formed thereon.

7. A sensor according to claim 1, wherein said functional element is a transistor.

8. A sensor according to claim 6, wherein said signal processing circuit is an amplifier.

9. A sensor according to claim 1, wherein said conductive member is a plate member elongated perpendicular to a surface of said substrate.

10. A sensor according to claim 1, wherein said semiconductor sensor is an acceleration sensor.

11. A sensor according to claim 1, wherein said semiconductor sensor is a pressure sensor.

* * * * *

UNITED STATES PATENT AND TRADEMARK OFFICE
CERTIFICATE OF CORRECTION

PATENT NO. : 5,285,097
DATED : February 8, 1994
INVENTOR(S) : YUTAKA HIRAI

It is certified that error appears in the above-indentified patent and that said Letters Patent is hereby corrected as shown below:

COLUMN 1

Line 10, "of" (second occurrence) should read --to--.
Line 38, "increasing" (second occurrence) should be deleted.

COLUMN 2

Line 8, "Further" should read --Further,--.
Line 23, "respective" should read --perspective--.
Line 46, "an" should read --an example of a--.

COLUMN 3

Line 41, "pointy" should read --points--.

COLUMN 13

Line 1, "n" should read --in--.

COLUMN 14

Line 55, "unit" should read --circuit--.

Signed and Sealed this

Twenty-seventh Day of September, 1994

Attest:

BRUCE LEHMAN

Attesting Officer          Commissioner of Patents and Trademarks